United States Patent
Burgin et al.

[19]

[11] Patent Number: 5,947,027
[45] Date of Patent: Sep. 7, 1999

[54] PRINTING APPARATUS WITH INFLATABLE MEANS FOR ADVANCING A SUBSTRATE TOWARDS THE STAMPING SURFACE

[75] Inventors: Timothy P. Burgin, Mesa; Vi-en Choong, Tempe; George N. Maracas; Thomas M. Mance, both of Phoenix, all of Ariz.

[73] Assignee: Motorola, Inc., Schaumburg, Ill.

[21] Appl. No.: 09/149,011

[22] Filed: Sep. 8, 1998

[51] Int. Cl.$^6$ .................................. B41F 1/32; B41F 1/34
[52] U.S. Cl. ........................ 101/474; 101/407.1; 101/327
[58] Field of Search .......................... 101/41, 327, 407.1, 101/474; 33/614, 616, 622

[56] References Cited

U.S. PATENT DOCUMENTS

| | | | |
|---|---|---|---|
| 3,591,285 | 7/1971 | Hakogi | 101/32 |
| 4,029,010 | 6/1977 | Deisting | 101/316 |
| 4,054,383 | 10/1977 | Lin et al. | 101/389.1 |
| 5,136,937 | 8/1992 | Nogawa | 101/287 |
| 5,669,303 | 9/1997 | Maracas et al. | 101/327 |
| 5,722,320 | 3/1998 | Meyer | 101/32 |

*Primary Examiner*—Edgar Burr
*Assistant Examiner*—Daniel J. Colilla
*Attorney, Agent, or Firm*—Eugene A. Parsons; William E. Koch

[57] ABSTRACT

A micro-contact printing apparatus includes a pressure chamber with a micro-contact printing stamp, a vacuum chuck, elastomeric membrane and mechanical stops attached to the vacuum chuck and positioned within the chamber. An extractor pin is attached to the chamber and accessible externally. The micro-contact printing stamp includes a flexible layer made from an elastomer with a stamping surface and attached to a support structure. A method for micro-contact printing a substrate surface includes advancing the substrate surface toward the stamping surface and contacting mechanical stops with support structure before the substrate surface physically contacts the stamping surface. Springs of members adjust the position of the substrate surface to be parallel with the stamping surface. The membrane is inflated to physically contact the substrate surface with the stamping surface, in such a manner that complete adhesion of the stamping surface to the substrate surface is achieved. The extractor pin is used to disengage the substrate surface from the stamping surface at the chamber pressure used in micro-contact printing, so that distortion of the printing pattern is minimized.

15 Claims, 3 Drawing Sheets

PRINTING APPARATUS WITH INFLATABLE MEANS FOR ADVANCING A SUBSTRATE TOWARDS THE STAMPING SURFACE

FIELD OF THE INVENTION

The present invention pertains to advance lithography on a nano scale in the areas of microelectronic devices, sensors, and optical elements and more particularly to an apparatus for stamping high resolution and complex patterns onto the surface of an article in a reproducible fashion.

BACKGROUND OF THE INVENTION

Prior art methods of patterning (etching or plating) surfaces with micron or sub-micron features include irradiative lithographic methods such as photolithography, electron-beam lithography, and x-ray lithography. With electron-beam lithography, the beam is rastered across the surface of the article to produce the pattern. This is a slow, expensive process. The equipment used in photo and x-ray lithographic methods do not easily pattern large-areas. The typical photolithographic printer for semiconductor applications has a field area on the order of 1 $in^2$. These small-area fields must subsequently be stitched together to form a continuous pattern over a large-area substrate. The stitching process is costly and time-consuming.

Accordingly, there exists a need for an improved apparatus and method for patterning large area surfaces with sub-micron features, which easily, economically, and reproducibly prints large-area fields, thereby providing high throughput.

Photolithographic aligners are known in the art. They are designed to align hard masks, which are rigid and planar. This is accomplished by aligning one or more alignment patterns on the hard mask with the corresponding one or more alignment patterns on the surface to be patterned. Thus, the pattern on the mask is brought into registration with the pattern on the surface. The alignment is accomplished by making the necessary displacements of the entire hard mask. Since the hard mask is not deformable, it does not tend to bow or otherwise mechanically distort in a manner which can distort the pattern of the mask.

The alignment and contact printing process in photolithographic equipment includes several steps. The mask is placed in a photomask holder. The substrate to be patterned, or wafer, is placed on a vacuum chuck, which includes a perforated plate. When the article is placed on the surface of the vacuum chuck, it is held in place by suction through the holes in the plate. The hard mask is then positioned above, and parallel to, the wafer, within several hundred microns. A prealignment is performed wherein one or more alignment patterns on the hard mask are brought into registration with one or more corresponding alignment patterns on the surface of the substrate or wafer. Depending on the geometry of the corresponding patterns, one or two pairs of alignment patterns are sufficient to bring the stamp printing pattern into registration with the overall wafer pattern. This is true regardless of the size of the mask. The alignment is accomplished by detecting the relative positions of the alignment patterns and making the necessary adjustments in the position of the hard mask and/or wafer by making x-y adjustments and angular/rotational adjustments in position. When alignment is achieved, the hard mask and substrate or wafer are brought into contact. The printing gap between the mask and wafer is 0–50 microns: hard contact is achieved by providing a high vacuum between the mask and wafer; soft contact is achieved by providing a low vacuum, about 50–500 mm Hg.

If the above method is utilized to contact a deformable, flexible stamp with a surface of a substrate, complete adhesion is often not achieved between the surface of the flexible stamp and the surface of the substrate. It is also extremely difficult to apply uniform pressure on the elastomeric stamp across the substrate. A prior art aligner would fail to properly contact a flexible stamp in a stamping process, resulting in non-reproducible and non-uniform printing. To be of any practical use, a stamping technique needs to provide reproducibility and uniformity.

Accordingly, there exists a need for an improved apparatus and method for using a flexible stamp to define micron and sub-micron features on the surface of an article and for stamping the surface so that the pattern on the flexible stamp is transferred reproducibly and uniformly.

Micro-contact printing of self-assembled molecular monolayers (SAMs) is known in the art. The SAMs are comprised of molecules, which have a functional group that chemically binds to certain types of solids. The remainder of the molecule (usually a long-chained hydrocarbon) interacts with neighboring molecules to form a dense structure which acts as a diffusion barrier to chemical species. Current micro-contact printing methods for producing a SAM on a surface, including the stamp aligner proposed in U.S. Pat. No. 5,725,788, issued Mar. 10, 1998, entitled "Apparatus and Method for Patterning a Surface", and copending U.S. patent application Ser. No. 08/978,797, filed Nov. 26, 1997, entitled"Micro-Contact Printing Stamp", and assigned to the same assignee, which apparatus is hereby incorporated by reference, cannot reliably or reproducibly print surfaces with micron and sub-micron features. This is attributed to the way contact is made and broken between the stamp and wafer.

Accordingly, the purpose of the present invention is to provide a cost-effective, reproducible method for patterning large-area surfaces using micro-contact printing of self-assembled molecular monolayers via an improved method to bring the stamp into and out of contact with the wafer.

SUMMARY OF THE INVENTION

The above problems and others are at least partially solved and the above purpose and others are realized in micro-contact printing apparatus comprising a micro-contact printing stamp including an elastomer stamp which has attached thereto a support structure. The support structure reduces bowing of the stamp and distortion of a stamping pattern formed in the elastomer stamp. The support structure is preferably made from transparent low thermal expansion coefficient material such as glass or quartz. The micro-contact printing apparatus includes the micro-contact printing stamp and further includes improved mechanisms to contact the stamp with the surface of the substrate and to remove the stamp from the surface of the substrate. The improved mechanism allows complete uniform adhesion to occur between the stamping surface and the surface of the substrate and further reduces distortion of the stamped pattern.

BRIEF DESCRIPTION OF THE DRAWINGS

Referring to the drawings.

Figure 1:
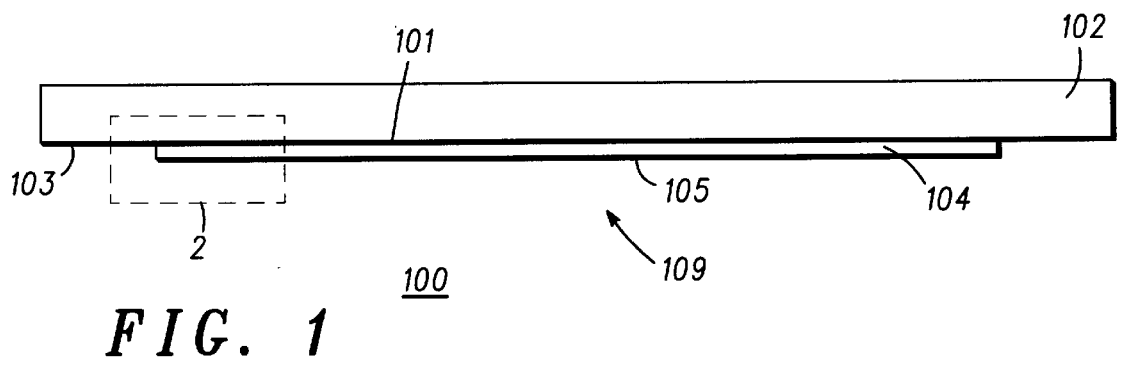
FIG. 1 is a cross-sectional view of an embodiment of a micro-contact printing stamp in accordance with the invention.

It will be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

DESCRIPTION OF THE PREFERRED EMBODIMENTS

Turning now to the figures, FIG. 1 is a cross-sectional view of an embodiment of a micro-contact printing stamp 100 in accordance with the present invention. Micro-contact printing stamp 100 includes a flexible layer 104 and a support structure 102. A first surface 101 of flexible layer 104 is attached in overlying engagement on support structure 102. Flexible layer 104 further includes a stamping surface 105, which opposes first surface 101. An exposed surface 103 of support structure 102 and stamping surface 105 define a major surface 109 of micro-contact printing stamp 100.

Figure 2:
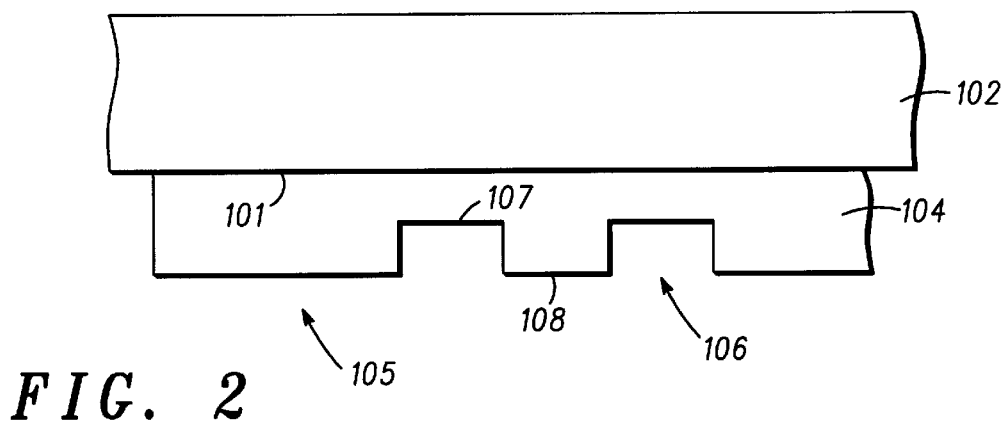
FIG. 2 is a partial, enlarged view of the micro-contact printing stamp of FIG. 1.

Flexible layer 104 is made from a flexible material. Preferably, flexible layer 104 is made from an elastomeric material. Most preferably, flexible layer 104 is made from polydimethylsiloxane (PDMS). Stamping surface 105 defines a stamping pattern, which is to be transferred to the surface of a substrate (not shown). An exemplary stamping pattern is illustrated in FIG. 2, which is a partial, enlarged view of micro-contact printing stamp 100. In general, the stamping pattern has micron and/or sub-micron features. Preferably, the features have characteristic dimensions of less than 10 microns. Most preferably, the features have characteristic critical dimensions of less than one micron. Stamping surface 105 defines a plurality of recessed surfaces 107, which define a plurality of depressions 106 between a plurality of contact surfaces 108 in major surface 109.

Complete adhesion of stamping surface 105 to the surface of a substrate is achieved when the plurality of contact surfaces 108 make physical contact with the surface of the substrate, while recessed surfaces 107 do not make physical contact with the surface of the substrate. Because the features of the stamping pattern are so small, it is critical that complete adhesion be achieved between stamping surface 105, including all of contact surfaces 108, and the substrate surface, so that a complete transfer of the stamping pattern is achieved during the printing process.

Due to the elasticity and/or local strain of flexible layer 104, runout or local deformations can occur in flexible layer 104. The runout and/or local deformations are drastically reduced by attaching flexible layer 104 to support structure 102 which is made from a semi-rigid material, such as glass, quartz, metal and the like. Preferably, support structure 102 is transparent for alignment purposes. In a representative configuration of micro-contact printing stamp 100, support structure 102 has a thickness within a range of 0.15 cm to 2.54 cm, and flexible layer 104 has a thickness within a range of 1 micron to 10,000 microns. The diameter (assuming a round stamp for purposes of stamping semiconductor wafers and the like) of support structure 102 can be, for example, within a range of 25.4 cm to 127 cm.

Figure 4:
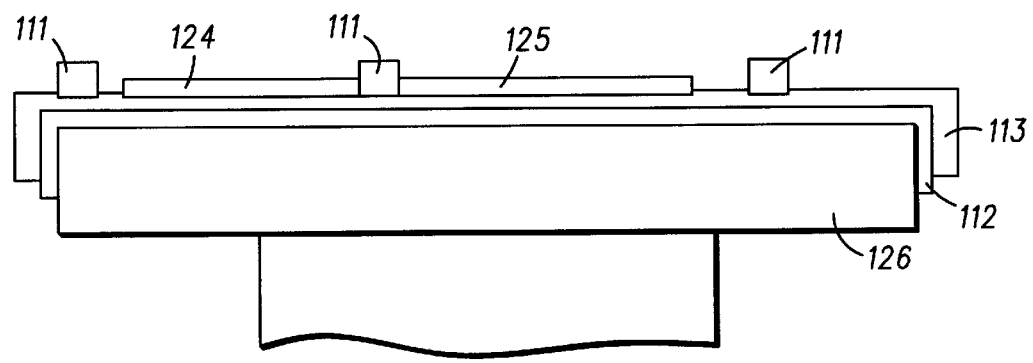
FIG. 4 is an enlarged view of the parallelizing and advancing means of a micro-contact printing apparatus in accordance with the invention.
Figure 3:
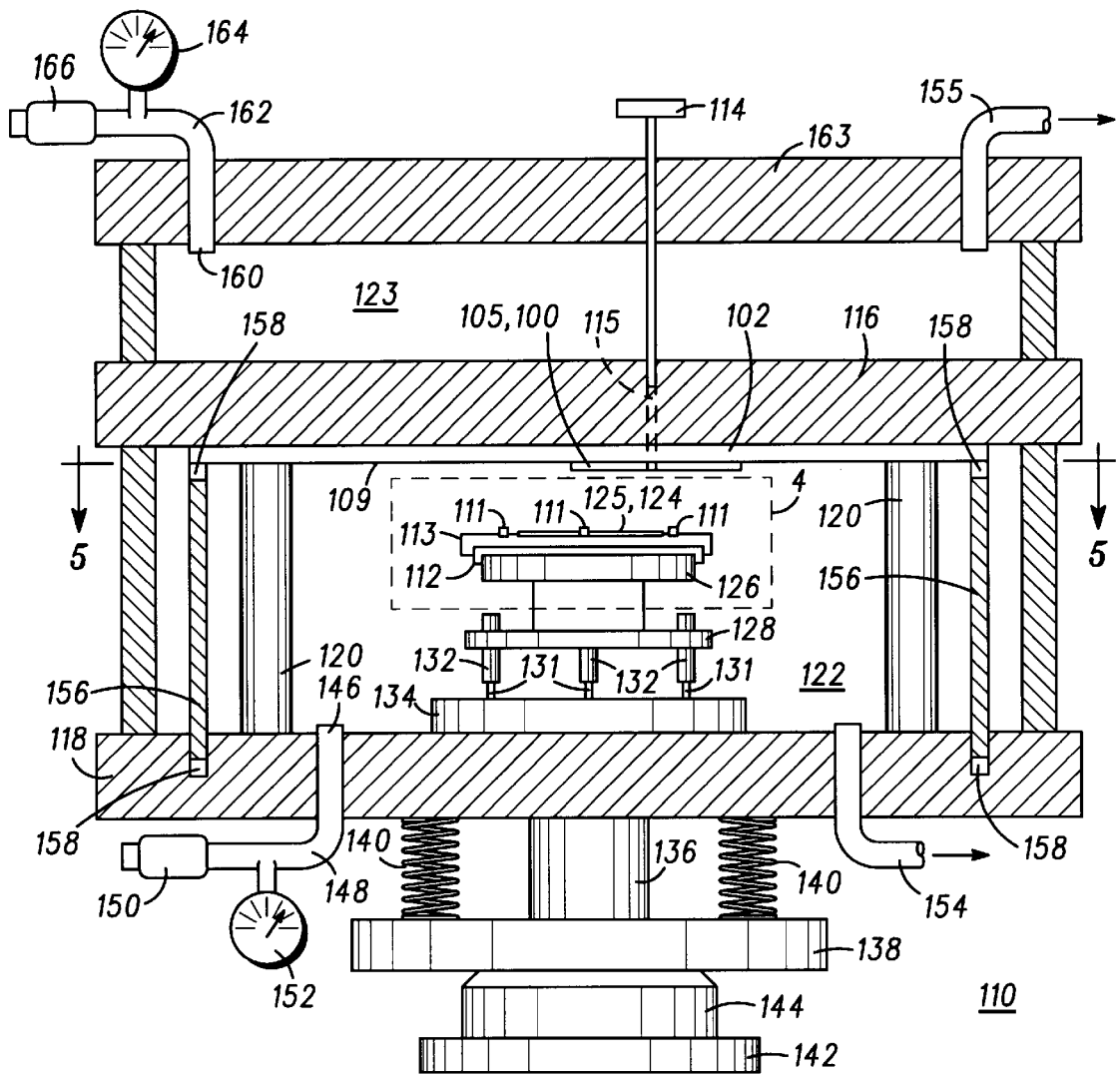
FIG. 3 is a cross-sectional view of a micro-contact printing apparatus in accordance with the invention.

Referring specifically to FIG. 3, a side elevational view is illustrated of micro-contact printing apparatus 110 in accordance with the present invention. Micro-contact printing apparatus 110 includes micro-contact stamp 100, which is used to stamp a surface 125 of a substrate 124. The main benefit of micro-contact printing apparatus 110 is the improved method to contact surface 125 of substrate 124 to stamping surface 105. An enlarged view of the relevant parts are illustrated in FIG. 4. First, through the use of mechanical stops 111, parallelizing surface 125 and stamp surface 105 is easily accomplished. Mechanical stops 111 allow surface 125 of substrate 124 to be placed in close proximity to stamping surface 105 of stamp 100 without making contact. Since mechanical stops 111 are of equal height, surface 125 has been parallelized to stamping surface 105. An elastomeric inflatable membrane 112, on which substrate 124 rests, is then inflated, bringing surface 125 of substrate 124 in contact with stamp surface 105. This provides pressure uniformity across stamping surface 105, promotes complete adhesion, reduces runout or local deformations and allows reproducible transfer of the printing pattern.

Further, micro-contact printing apparatus 110 provides improved breaking of the contact between surface 125 of substrate 124 and stamping surface 105. Previously, and using some of the components of the apparatus of FIG. 3 for purposes of explaining the prior operation, after contact is made, a bottom chamber 122 is vented to atmosphere. Contact is broken by physically lifting a top plastic plate 116 to which flexible stamp 100 is attached. However, before contact is broken, there is a pressure mismatch between bottom chamber 122 and depressions 106 in major surface 109 of stamp surface 105. Because depressions 106 of stamp surface 105 are sandwiched between stamp surface 105 and surface 125 of substrate 124, the pressure mismatch distorts the printed pattern. In the present structure, an extractor pin 114 is mounted above top plastic plate 116 and allows for the disengagement of surface 125 from stamping surface 105 before bottom chamber 122 is vented to atmosphere. This preserves the integrity of the printed pattern and allows reproducible transfer of the printed pattern.

As illustrated in FIG. 3 and with further reference to FIG. 4, micro-contact printing apparatus 110 includes a platform structure 126, which is used to hold substrate 124 and to advance substrate 124 toward micro-contact printing stamp 100. In this preferred embodiment, platform structure 126 is a vacuum chuck, which is connected to a vacuum line (not shown) for providing suction at the location of substrate 124. The top of platform structure 126 is outfitted with an elastomeric membrane 112 stretched across a perforated plate connected to an external vacuum port. The pressure on the bottom of the membrane 112 is controlled by a needle valve (not shown) open to atmosphere. Membrane 112 is sealed to vacuum chuck 126 with a clamp ring 113. Clamp ring 113 is outfitted with mechanical stops 111. Substrate 124 is positioned on membrane 112, so that surface 125 opposes stamping surface 105 of micro-contact printing stamp 100. Extractor pin 114 is mounted in top chamber 116, and aligned with an extractor hole 115 positioned at the edge of the stamping region.

Platform structure 126 includes a lip 128 to which are connected a plurality of members 132, that rests on a support platform 134. Support platform 134 can be raised and lowered by compressed air. Members 132 provide the equalizing of pressure exerted by micro-contact printing stamp 100 across surface 125. In the preferred embodiment, members 132 are adjustable, spring-loaded shock absorbers. Each member 132 has an outer cylinder. A spring is fit snugly within an inner cylinder, which fits within the outer cylinder. A plunger 131 is attached at the outer end of each spring.

The springs and plungers are capable of moving up and down, but cannot move laterally. Thus, the heights of members 132 are made adjustable.

At the inner end of each adjustable, spring-loaded shock absorber is disposed an adjustment screw (not shown), which allows the adjustment of the spring tension of the plurality of members 132. Members 132 are mechanically attached to lip 128 of platform structure 126. Members 132 extend between platform structure 126 to a second platform structure 134, and are disposed about the circumference of platform structure 126. For example, three members 132 can be attached in an equilateral triangle configuration about circular platform structure 126 for supporting platform structure 126.

Figure 5:
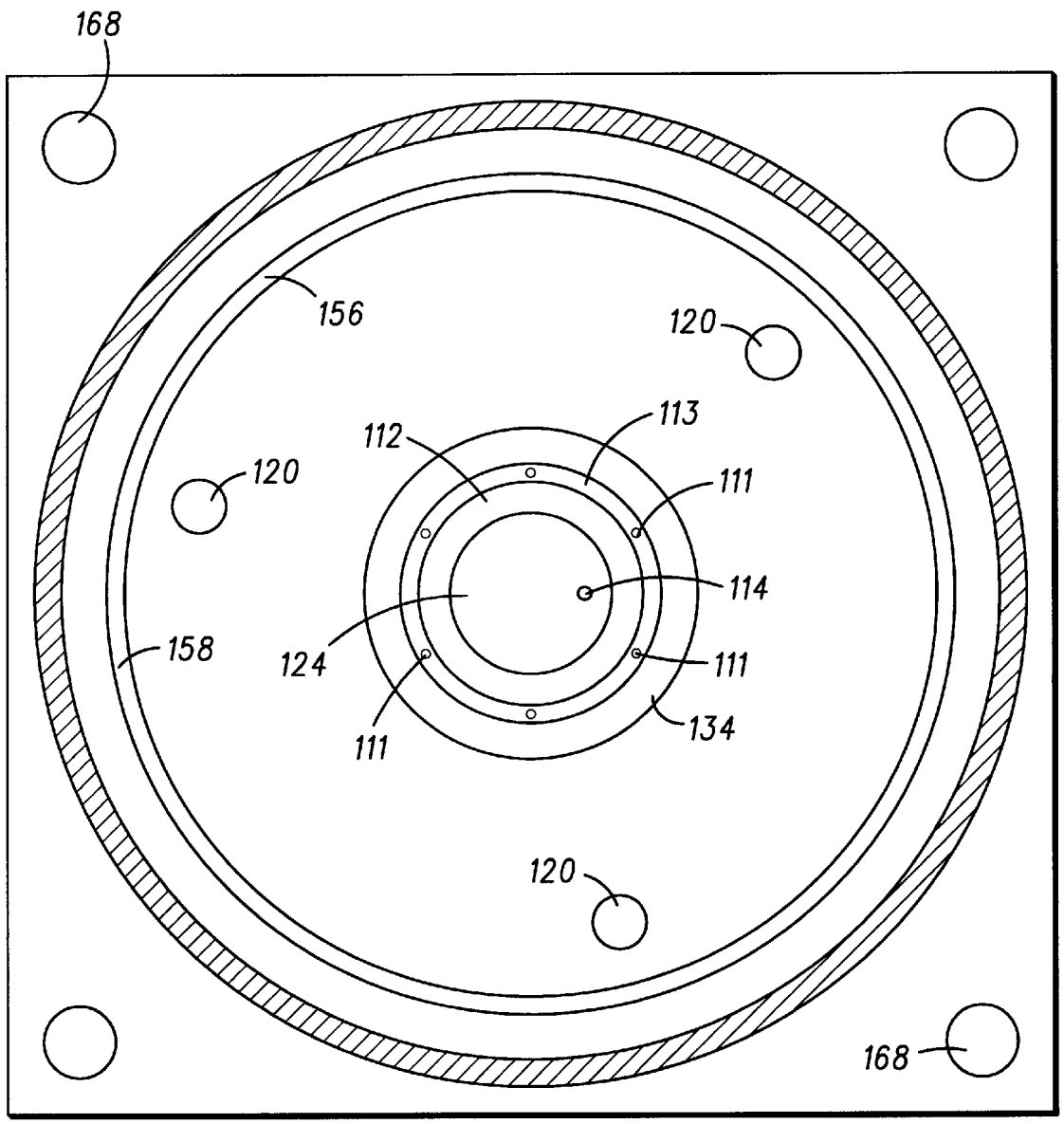
FIG. 5 is a sectional view taken along the lines 5—5 of FIG. 3.

Referring specifically to FIG. 5, a sectional view taken along the line 5—5 of FIG. 3 is illustrated in which mechanical stops 111 are shown. Extractor pin 114 positioned at the edge of the stamping region of substrate 124 is also illustrated. Further illustrated in FIG. 5 are a plurality of alignment posts 168, which are used to align micro-contact printing stamp 100 with substrate 124.

Referring once again to FIG. 3, plungers 131 of members 132 are attached to second platform structure 134, which, in a first configuration, rests on a bottom plate 118 of micro-contact printing apparatus 110. Bottom plate 118 is one of the structures that define variable-pressure bottom chamber 122 of micro-contact printing apparatus 110. Bottom chamber 122 is further defined by outer walls 156 and by major surface 109 of micro-contact printing stamp 100. Bottom chamber 122 is connected through a conduit 154 to a vacuum pump (not shown), as indicated by an arrow in FIG. 3.

The pressure in bottom chamber 122 is reduced, using the vacuum pump, to a pressure suitable to ameliorate the problem of entrapment of air between surface 125 and stamping surface 105 during the stamping process. An exemplary pressure useful for the embodiment of FIG. 3 is about 150 mmHg. To hold substrate 124, the vacuum applied to the vacuum chuck is at a lower pressure than the pressure within bottom chamber 122. The pressure within bottom chamber 122 is monitored with a pressure gauge 152, which is connected to a sampling tube 148. Sampling tube 148 is fed through a hole 146 within bottom plate 118. The pressure can further be adjusted using a valve 150, which is at the end of sampling tube 148.

In the embodiment of FIG. 3, support structure 102 of micro-contact printing stamp 100 is affixed by a retaining ring to plastic plate 116, which is about 1.9 cm thick. The diameter of substrate 124 is about 7.5 cm to 10.0 cm and the diameter of support structure 102 is about 35.5 cm. Plastic plate 116 partially defines an upper variable-pressure chamber 123. Upper chamber 123 is positioned above micro-contact printing stamp 100. The pressure within upper chamber 123 is manipulated to control the configuration of micro-contact printing stamp 100 after the evacuation of bottom chamber 122. The preferred configuration of micro-contact printing stamp 100 is that which promotes complete adhesion of stamping surface 105 to surface 125 of substrate 124 during the stamping step. Preferably, the pressures within bottom and upper variable-pressure chambers 122, 123 are selected so that micro-contact printing stamp 100 is maintained in a substantially planar configuration. An exemplary pressure useful for upper variable-pressure chamber 123 of the embodiment of FIG. 3 is 150 mmHg. In the preferred embodiment of a method for micro-contact printing surface 125 of substrate 124 in accordance with the invention, the pressures within lower and upper variable-pressure chambers 122, 123 are constant during the stamping step.

Upper chamber 123 is connected through a conduit 155 to a vacuum pump (not shown), as indicated by an arrow in FIG. 3. The pressure within upper chamber 123 is metered with a pressure gauge 164, which is connected to a sampling tube 162. Sampling tube 162 is fed through a hole 160 within a top plate 163 forming upper variable-pressure chamber 123 of micro-contact printing apparatus 110. The pressure therein can further be adjusted using a valve 166, which is at the end of sampling tube 162.

Micro-contact printing apparatus 110 further includes a mounting plate 138, which is coupled to second platform structure 134 via a cylindrical member 136. Mounting plate 138 is connected to first ends of a plurality of springs 140. The opposing ends of the plurality of springs 140 are connected to bottom plate 118, as illustrated in FIG. 3. An air actuated piston 142 having a head 144 in contact with mounting plate 138 is used to raise mounting plate 138. Cylindrical member 136 is slidably mounted in bottom plate 118, so that, when head 144 of air actuated piston 142 lifts plate 138, cylindrical member 136 raises second platform structure 134. In this manner substrate 124 is advanced toward micro-contact printing stamp 100. Other configurations useful for advancing substrate 124 will occur to those skilled in the art. For example, a hydraulic piston can alternatively be used.

Micro-contact printing apparatus 110 further includes a plurality of compression stops 120, which are positioned one each in radial alignment with the members 132. Compression stops 120 are cylindrical posts, which maintain the distance between micro-contact printing stamp 100 and bottom plate 118 at the location of stamping surface 105. When the pressure is reduced within bottom variable-pressure chamber 122, a plurality of vacuum seals 158 may compress under the load, thereby altering a separation distance between micro-contact printing stamp 100 and bottom plate 118. Compression stops 120 are not affixed with vacuum seals. Compression stops 120 ensure that the compression of plurality of vacuum seals 158 does not affect the separation distance at the location of stamping surface 105. Compression stops 120 provide a constant, repeatable separation distance, which is also independent of the pressure within bottom variable-pressure chamber 122. Compression stops 120 also serve to prevent deformation of micro-contact printing stamp 100 beyond a selected maximum extent.

In a method for micro-contact printing surface 125 of substrate 124, in accordance with the invention, stamping surface 105 is first wetted with a stamping liquid. In the preferred embodiment, it is desired to form a self-assembled monolayer (SAM) on surface 125. Thus, the stamping liquid includes a solution containing a SAM-forming molecular species, such as hexadecanethiol. Other chemistries can be used for different surfaces. General descriptions of SAMs and flexible stamps suitable for use within micro-contact printing apparatus 110 are disclosed in U.S. Pat. No. 5,725,788, issued Mar. 10, 1998, entitled "Apparatus and Method for Patterning a Surface", and copending U.S. patent application Ser. No. 08/978,797, filed Nov. 26, 1997, entitled "Micro-Contact Printing Stamp", and assigned to the same assignee, which apparatus is hereby incorporated by reference.

An exemplary wetting solution is a 1 mm solution of hexadecanethiol in acetone. Stamping surface 105 is soaked in the wetting solution for about 10 minutes. Then, excess solution is removed therefrom by rinsing with acetone. Excess acetone is removed by exposure of stamping surface 105 to low vacuum conditions.

The primed micro-contact printing stamp 100 is aligned above substrate 124, above platform structure 126. Then, bottom and upper variable-pressure chambers 122, 123 are evacuated sufficiently to establish the desired pressures therein, as described with reference to FIG. 3. Air-actuated piston 142 is used to raise platform structure 126 until stopped by mechanical stops 111. Separation between surface 125 of substrate 124 and stamping surface 105 is determined by the height of mechanical stops 111 (~100 microns in the present embodiment). Variations in the pressure between mechanical stops 111 and support structure 102 cause the heights of members 132 to adjust. These adjustments result in a substantially parallel spaced relationship between stamping surface 105 and surface 125 of substrate 124. Then, elastomeric membrane 112 is inflated to bring surface 125 of substrate 124 into physical contact with stamping surface 105.

During the stamping step, the gas pressure in elastomeric membrane 112 in tandem with the further adjustments in the heights of member 132 provides pressure uniformity across stamping surface 105. The characteristics (e.g. gas pressure, spring tension and shock absorption characteristics) of elastomeric membrane 112, and members 132 are selected to result in a final stamping pressure across stamping surface 105, which is sufficient to result in complete adhesion, but which is not high enough to initiate contact between recessed surfaces 107 and surface 125 of substrate 124. After the desired extent of contact between surface 125 and stamping surface 105 has been achieved, they are separated from one another by depressing extractor pin 114 so that a SAM remains on surface 125. The removal is done before bottom and upper variable-pressure chambers 122 and 123 are vented to atmosphere. The SAM has the stamping pattern of stamping surface 105.

It is desired to be understood that the structure for detecting the relative positioning of surface 125 with respect to stamping surface 105 is not limited to that described herein. It is further desired to be understood that the structure for detecting and adjusting for pressure variations across stamping surface 105 is not limited to that described herein. Other detection and adjustment elements can be employed. For example, adjustable, spring-loaded shock absorbers can alternatively be attached to the support structure of the micro-contact printing stamp. In another configuration mechanical elements are attached to the substrate for adjusting the position of the substrate in response to signals transmitted from position detectors, which detect the relative position of the substrate surface with respect to the stamping surface.

In summary, the micro-contact printing stamp of the invention includes an elastomer stamp, which has attached thereto a rigid support structure. The support structure reduces bowing of the stamp and distortion of the pattern in the elastomer stamp. The micro-contact printing stamp and improved parallelizing structure provide means for configuring a surface of a substrate substantially parallel to a stamping surface of the micro-contact printing stamp. The micro-contact printing stamp further includes or makes possible improved methods to contact the substrate with the stamp to promote complete adhesion between the stamping surface, which has micron and/or sub-micron features, and the surface of the substrate. The micro-contact printing stamp additionally includes or makes possible an improved method to remove the substrate from the stamp at the chamber pressure used during the printing process which reduces distortion of the printed pattern.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What we claim is:

1. Micro-contact printing apparatus for stamping a surface of a substrate, the micro-contact printing apparatus comprising:

a micro-contact printing stamp having a major surface including a stamping surface, the stamping surface having a plurality of contact surfaces;

advancing means for advancing the surface of the substrate toward the stamping surface of the micro-contact printing stamp;

parallelizing and contact achieving means coupled to the advancing means for providing a substantially parallel spaced relationship between the stamping surface and the surface of the substrate to produce adhesion of the plurality of contact surfaces to the surface of the substrate; and disengaging means for disengaging the surface of the substrate from the stamping surface so as to reduce distortion of the printed pattern.

2. Micro-contact printing apparatus for stamping a surface of a substrate as claimed in claim 1 wherein the parallelizing and contact achieving means is responsive to the relative position of the surface of the substrate with respect to the stamping surface for providing a substantially parallel spaced relationship between the stamping surface and the surface of the substrate.

3. Micro-contact printing apparatus for stamping a surface of a substrate as claimed in claim 1 wherein the parallelizing and contact achieving means is responsive to pressure variations at the major surface of the micro-contact printing stamp for providing a substantially parallel spaced relationship between the stamping surface and the surface of the substrate.

4. The micro-contact printing apparatus as claimed in claim 1 wherein the surface of the substrate is disengaged from contact with the stamping surface within a pressure chamber and at a chamber pressure used in micro-contact printing.

5. Micro-contact printing apparatus for stamping a surface of a substrate, the micro-contact printing apparatus comprising:

a pressure chamber;

a micro-contact printing stamp mounted in the pressure chamber and having a major surface including a stamping surface, the stamping surface having a plurality of contact surfaces;

a first platform structure positioned within the pressure chamber and designed to receive the substrate so that the surface of the substrate opposes the stamping surface of the micro-contact printing stamp;

mechanical stops attached to the platform structure and designed to allow the placing of the substrate in a close proximity position to the stamping surface without bringing the two in contact;

an elastomeric membrane attached to platform structure and designed to bring the surface of the substrate and the stamping surface in contact from the close proximity position; and an extractor pin attached to the pressure chamber and designed to disengage the surface of substrate from the stamping surface at a chamber pressure used in micro-contact printing.

6. The micro-contact printing apparatus as claimed in claim 5 wherein the platform structure includes a vacuum chuck.

7. The micro-contact printing apparatus as claimed in claim 5 wherein the micro-contact printing stamp includes a support structure, and wherein the mechanical stops oppose the support structure of the micro-contact printing stamp allowing the surface of substrate to be brought in close proximity to the stamping surface without bringing the two in contact.

8. The micro-contact printing apparatus as claimed in claim 5 wherein the elastomeric membrane includes an inflatable elastomer diaphragm.

9. The micro-contact printing apparatus as claimed in claim 5, further including a second platform structure opposing the first platform structure, and further including members attached to the first platform structure and having adjustable heights and extending between the first and second platform structures.

10. The micro-contact printing apparatus as claimed in claim 9 wherein each of the members includes a spring extending along a portion of a height thereof to provide adjustment of the heights of the members in response to pressure variations at the major surface of the micro-contact printing stamp.

11. A method for micro-contact printing a surface of a substrate comprising the steps of:

providing a pressure chamber pressurized at a chamber pressure used in micro-contact printing;

providing a micro-contact printing stamp having a stamping surface in said pressure chamber;

advancing the surface of the substrate toward the stamping surface of the micro-contact printing stamp;

adjusting the relative position of the surface of the substrate with respect to the stamping surface to provide a substantially parallel spaced relationship therebetween;

contacting the stamping surface with the surface of the substrate; and disengaging the surface of the substrate from the stamping surface.

12. The method for micro-contact printing a surface of a substrate as claimed in claim 11, further including, concurrent with the step of contacting the stamping surface with the surface of the substrate, a step of adjusting the relative position of the surface of the substrate with respect to the stamping surface in a manner that provides pressure uniformity across the stamping surface.

13. The method for micro-contact printing a surface of a substrate as claimed in claim 11, further including a step of wetting the stamping surface with a stamping liquid prior to the step of advancing the surface of the substrate toward the stamping surface.

14. The method for micro-contact printing a surface of a substrate as claimed in claim 13 wherein the stamping liquid includes a self-assembled monolayer.

15. The method for micro-contact printing a surface of a substrate as claimed in claim 13 wherein the step of contacting the stamping surface with the surface of the substrate includes the steps of providing an inflatable elastomeric membrane, positioning one of the substrate and the micro-contact printing stamp on the membrane, and inflating the membrane to contact the stamping surface with the surface of the substrate.

* * * * *